United States Patent
Labarthe et al.

(10) Patent No.: US 9,921,271 B2
(45) Date of Patent: Mar. 20, 2018

(54) METHOD AND DEVICE FOR DETERMINING THE REMAINING RUN TIME OF A BATTERY

(71) Applicant: Fresenius Vial SAS, Brézins (FR)

(72) Inventors: Sébastien Labarthe, Voiron (FR); José Rubio, Montferrat (FR)

(73) Assignee: Fresenius Vial SAS, Brezins (FR)

( * ) Notice: Subject to any disclaimer, the term of this patent is extended or adjusted under 35 U.S.C. 154(b) by 172 days.

(21) Appl. No.: 15/038,631

(22) PCT Filed: Jan. 6, 2015

(86) PCT No.: PCT/EP2015/050082
§ 371 (c)(1),
(2) Date: May 23, 2016

(87) PCT Pub. No.: WO2015/106986
PCT Pub. Date: Jul. 23, 2015

(65) Prior Publication Data
US 2016/0299196 A1    Oct. 13, 2016

(30) Foreign Application Priority Data
Jan. 14, 2014 (EP) .................................. 14305048

(51) Int. Cl.
*G01R 31/36* (2006.01)
*G06F 11/30* (2006.01)

(52) U.S. Cl.
CPC ....... *G01R 31/3651* (2013.01); *G01R 31/362* (2013.01)

(58) Field of Classification Search
CPC .................................................. G01R 31/3651
See application file for complete search history.

(56) References Cited

U.S. PATENT DOCUMENTS

2002/0120906 A1    8/2002  Xia et al.
2005/0007073 A1*   1/2005  James ............... G01R 19/16542
                                                           320/132
(Continued)

FOREIGN PATENT DOCUMENTS

DE    20 2004 019 280 U1    5/2015

*Primary Examiner* — Phuong Huynh
(74) *Attorney, Agent, or Firm* — Cook Alex Ltd.

(57) ABSTRACT

The invention relates to a method for determining the remaining run time ($\Delta t_i$) of a battery (4) that is supplying power to an appliance (2). The method comprises the steps of: —during operation of the appliance (2) measuring the voltage ($U_i$) supplied by the battery (4) at different points in time ($t_i$) in order to obtain time-voltage-pairs ($t, U_i$), and—calculating the remaining run time ($\Delta t_i$) of the battery (4), wherein the calculation is based on the measured time-voltage-pairs ($t_i$, $U_i$) and on a relationship between the measured voltage ($U_i$), the corresponding point in time ($t_i$) and the total run time ($T_1$) of the battery (4) which can be derived from a time dependent formulation of the Nernst equation for this relationship.

14 Claims, 2 Drawing Sheets

(56) References Cited

U.S. PATENT DOCUMENTS

Figure 1:
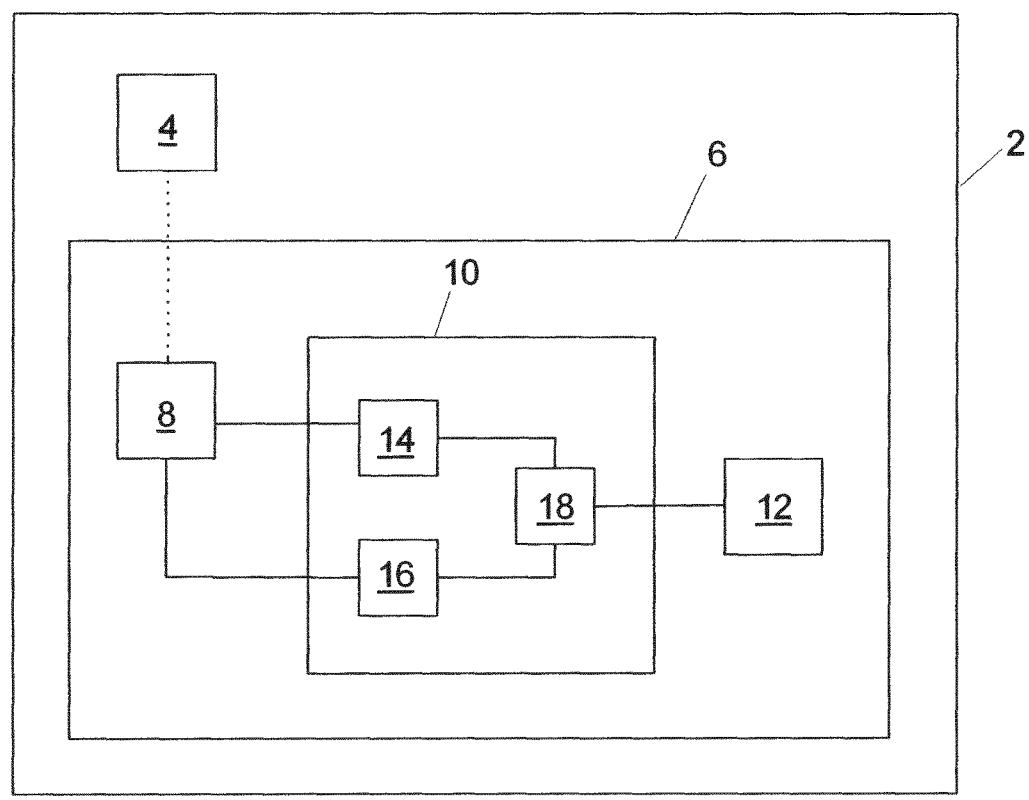

2006/0250137 A1\* 11/2006 Frey .................. G01R 31/3651
 324/426
2012/0277832 A1 11/2012 Hussain \* cited by examiner

METHOD AND DEVICE FOR DETERMINING THE REMAINING RUN TIME OF A BATTERY

The invention relates to a method and a device for determining the remaining run time of a battery that is supplying power to an appliance. In particular the method and the device are adapted to determine the remaining run time of the battery while the appliance is running.

The prediction of the end of the run time or the remaining run time of a battery is of particular relevance for devices powered by a battery that need to run without interruption. These devices include medical devices, such as infusion pumps infusing medication or nutrients for a (par)enteral nutrition into a patient.

Such methods and corresponding devices are known from the prior art. One known method to determine the state of charge of a battery, relies on a measurement of the current delivered by the battery. Integrating the current over time corresponds to the consumption of charge. If the initial state of charge is known, the present state of charge can thus be deduced.

Another method is based on a battery model relating to the measurement of the battery parameters, such as voltage, current and temperature. The state of charge of the battery is deduced from these measurements by neural networks or Kalman filter techniques using an appropriate model. This method however requires a calibration of the model parameters and high performance calculation resources.

It is an object of the present invention to provide a method for determining the remaining run time of a battery that provides precise results without the need for high performance calculation resources. In particular the precision should be such that the results determined by the method can be used to trigger an alarm, wherein standards relating to the time delay between the alarm signal and the end of the run time of the battery are respected.

According to claim 1 the method comprises measuring the voltage supplied by the battery at different points in time during operation of the appliance in order to obtain time-voltage-pairs and performing a calculation to determine the remaining run time of the battery. The calculation is based on the measured time-voltage-pairs on the one hand and on a relationship between the measured voltage, the corresponding points in time and the total run time of the battery on the other hand. This relationship is derived from a time dependent formulation of the Nernst equation.

According to an embodiment, the calculation of the remaining run time of the battery is carried out (only) if the measured voltage drops below (or reaches) a predetermined voltage threshold value. Before reaching the predetermined voltage threshold value, the voltage can be measured alone without measurement of the corresponding point in time. Once the measured voltage has dropped below (or reaches) the predetermined voltage threshold value, the voltage is measured in combination with the corresponding point in time. Alternatively, the time-voltage-pairs can be measured throughout the entire method, before and after the predetermined voltage threshold value has been reached. In any case, once the measured voltage has dropped below (or reaches) the predetermined voltage threshold value, the voltage is measured in combination with the corresponding point in time. As the calculation is not performed during the entire operation of the appliance, but only in case that the measured voltage is found to be below a predetermined voltage threshold value, the computing capacity necessary to carry out the method can be reduced. The remaining run time can be determined by substracting the actual point in time from the calculated total run time.

The relevant time dependent formulation of the Nernst equation can be expressed by $$U_i = C_1 + C_2 T \cdot \log\left(\frac{T_1 - t_i}{T_2 + t_i}\right)$$

with—$U_i$ being the measured voltage supplied by the battery at the point in time $t_i$,
$C_1$ being a constant relating to the standard cell potential $\Delta E^0$ of the battery,
$C_2$ being a constant that depends on the type of battery,
T being the temperature,
$T_1$ being the total run time of the battery, and
$T_2$ being a parameter depending on the initial state of the battery.

More specifically, the time dependent Nernst equation reads $$U_i = \Delta E^0 + \frac{2.3 \cdot RT}{zF} \cdot \log\left(\frac{T_1 - t_i}{T_2 + t_i}\right)$$

with—$U_i$ being the measured voltage at the point in time $t_i$,
$\Delta E^0$ being the standard cell potential of the battery in Volts,
R being the the universal gas constant (R=8.314 JK$^{-1}$ mol$^{-1}$),
T being the temperature in Kelvin,
z being the number of exchanged electrons,
F being the Faraday constant (F=96485.34 JV$^{-1}$ mol$^{-1}$),
$T_1$ being the total run time of the battery, and
$T_2$ being a parameter depending on the initial state of the battery.

As will be shown below, the time dependent Nernst equation may be reformulated to read $$x_i = \frac{T_1 - t_i}{T_2 + t_i}, \text{ with } x_i = 10^{\left(\frac{U_i - C_1}{C_2 T}\right)}$$

or, more specifically, $$x_i = 10^{\left(\frac{(U_i - \Delta E^0)zF}{2.3 RT}\right)}.$$

According to a further aspect of the invention, the total run time of the battery can be determined by linear regression of the time-voltage-pairs using a relationship between the measured voltage, the corresponding points in time and the total run time of the battery which can be expressed by a linear equation that is derived from a time dependent formulation of the Nernst equation. A calculation based on a linear equation requires less computing capacity than a calculation based on the logarithmic Nernst equation. In particular, the computing capacity required by a method using a linear equation derived from the Nernst equation requires less computing capacity than neural networks or Kalman filter techniques known from the prior art.

The linear equation may be expressed by $$x_i = \frac{T_1 - t_i}{T_2} \text{ with } x_i = 10^{\left(\frac{U_i - C_1}{C_2 T}\right)}$$

or, more specifically, $$x_i = 10^{\left(\frac{(U_i - \Delta E^0) zF}{2.3 \, RT}\right)}.$$

The linear equation is an approximation of the equation $$x_i = \frac{T_1 - t_i}{T_2 + t_i}$$

and is a particularly good representation of the Nernst equation for those measured time-voltage-pairs with values for $t_i$ approaching $T_1$. The underlying expression $$x_i = \frac{T_1 - t_i}{T_2 + t_i}$$

is nothing else than a reformulation of the above Nernst equation as will be shown in the following:

$$U_i = \Delta E^0 + \frac{2.3 \cdot RT}{zF} \cdot \log\left(\frac{T_1 - t_i}{T_2 + t_i}\right) \Leftrightarrow (U_i - \Delta E^0) \cdot \frac{zF}{2.3 \cdot RT} =$$

$$\log\left(\frac{T_1 - t_i}{T_2 + t_i}\right) \Leftrightarrow 10^{(U_i - \Delta E^0) \frac{zF}{2.3 \cdot RT}} =$$

$$10^{\log\left(\frac{T_1 - t_i}{T_2 + t_i}\right)} \Leftrightarrow 10^{(U_i - \Delta E^0) \frac{zF}{2.3 \cdot RT}} = \frac{T_1 - t_i}{T_2 + t_i}.$$

The total run time of the battery can be determined by making a least square fit of the time-voltage-pairs for values of $t_i$ approaching $T_1$ and using the linear equation $$x_i = \frac{T_1 - t_i}{T_2}.$$

In order to reduce noise that might adversely affect the quality of the calculation, the measured values can be smoothed. Preferably, smoothing is applied only to the values measured after the predetermined voltage threshold value has been reached. In the case that the time-voltage-pairs are measured throughout the entire method, smoothing can alternatively be applied also to the values measured before the predetermined voltage threshold value has been reached or to the entire set of measured values. Smoothing can be performed by applying a gliding window to the measured time-voltage-pairs, the time-voltage-pair with the maximum voltage value being selected from each window to perform the calculation.

If the calculated remaining run time is found to be below a predetermined threshold value, an output signal can be generated warning a user of the (imminent) end of the run time of the battery.

According to yet another aspect of the invention the above-mentioned problem is solved by a device for determining the remaining run time of a battery according to claim 11 and by a machine-readable storage medium according to claim 14.

Figure 2:
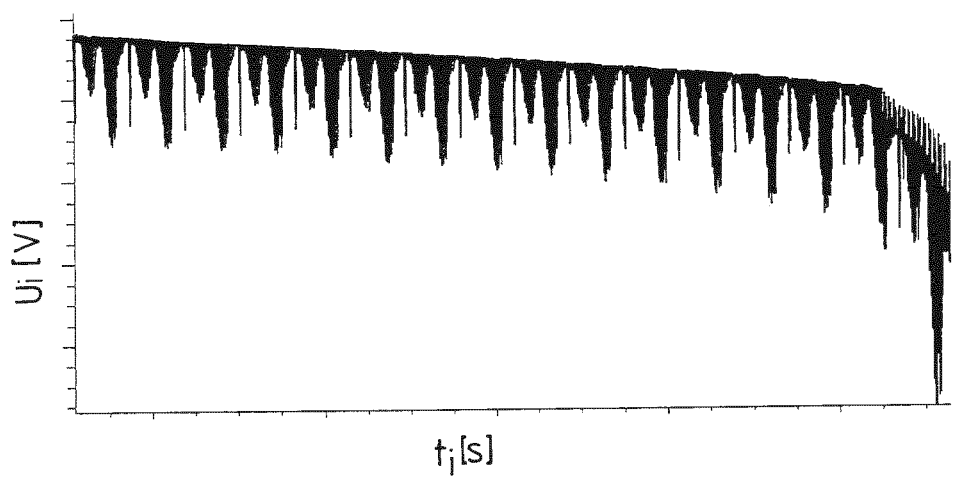
Figure 3:
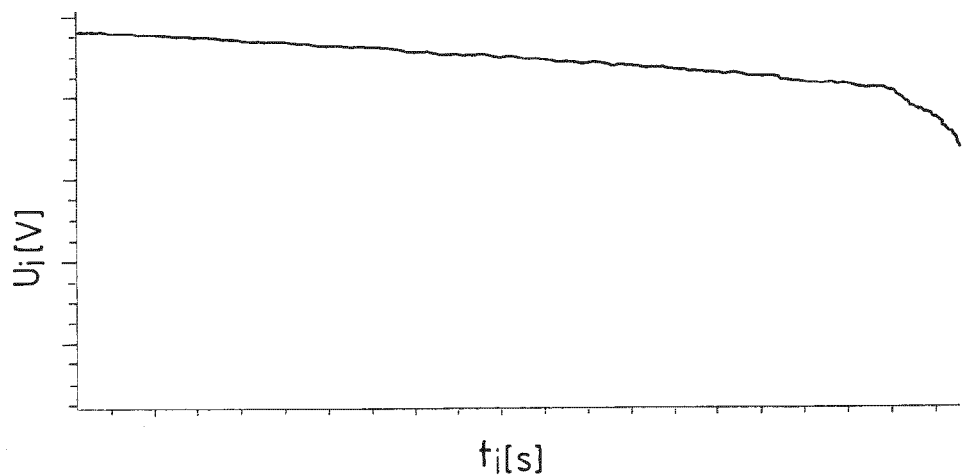

The idea underlying the invention shall subsequently be described in more detail with reference to the embodiments shown in the figures. Herein, FIG. 1 shows a schematic view of an appliance powered by a battery and comprising a device for determining the remaining run time of the battery;

FIG. 2 shows an exemplary measurement of the voltage supplied by a battery as a function of time, the measurement being intended to be used to carry out a method for determining the remaining run time of a battery according to an embodiment of the invention; and FIG. 3 shows the measurement according to FIG. 2 after smoothing.

FIG. 1 shows an appliance 2 powered by a battery 4 and comprising a device 6 for determining the remaining run time $\Delta t_i$ of the battery 4 that is supplying power to the appliance 2. The appliance 2 can be a medical device, such as a syringe pump. The battery 4 may be an electrochemical cell, for example a Nickel-metal hydride battery.

The device 6 comprises a measuring device 8 and a computing device 10. In the embodiment shown in FIG. 1 the device 6 further comprises output means 12.

The measuring device 8 is adapted to measure the voltage $U_i$ supplied by the battery 4. Additionally, the measuring device 8 is adapted to measure the corresponding point in time $t_i$. Preferably, the measuring device 8 measures the voltage $U_i$ throughout the entire discharge of the battery 4. After having reached a predetermined voltage threshold value $U_{tr}$, the voltage measurement may be performed periodically, e.g. every second. Before reaching this predetermined voltage threshold value $U_{tr}$, the frequency of the voltage measurement may be reduced. According to an alternative, the voltage measurement is performed only on request by a user of the device 6. The measurement of the corresponding point in time $t_i$ is preferably performed only after the predetermined voltage threshold value $U_{tr}$ has been reached. Alternatively, the measurement of the corresponding point in time $t_i$ can be performed throughout the entire discharge of the battery 4 together with the voltage measurement. When the voltage measurement is performed together with the measurement of the corresponding points in time $t_i$, time-voltage-pairs $t_i$, $U_i$ are generated. Each measured voltage $U_i$ can be attributed to a specific point in time $t_i$.

The computing device 10 comprises a comparator 14, a memory 16 and a central processing unit (CPU) 18.

The comparator 14 is adapted to compare the measured voltage $U_i$ with the predetermined voltage threshold value $U_{tr}$. The voltage threshold value $U_{tr}$ may depend on the nature of the appliance 2 and/or on the type of battery 4. During discharge of the battery 4, its voltage level behaves roughly constant over a significant time interval. The voltage threshold value $U_{tr}$ may in particular be chosen such as to be slightly below this constant voltage level.

The memory 16 is a machine-readable storage medium and adapted to save the measured time-voltage-pairs $t_i$, $U_i$ as well as the predetermined voltage threshold value $U_{tr}$ and a machine readable program code adapted to calculate the remaining run time $\Delta t_i$ of the battery 4. Alternatively the measured time-voltage-pairs $t_i$, $U_i$ and the predetermined voltage threshold value $U_{tr}$ can be stored in a separate memory (not shown).

The CPU 18 is linked to the comparator 14 and to the memory 16. The CPU 18 is adapted to analyse the output of the comparator 14. In case that the measured voltage $U_i$ is below the voltage threshold value $U_{tr}$, the CPU 18 initiates and performs a calculation to determine the remaining run time $\Delta t_i$ of the battery 4 on the basis of the program code saved in memory 16. In case that the measured voltage $U_i$ is found to be above the voltage threshold value $U_{tr}$, the CPU 18 does not initiate said calculation.

The result of the calculation is used to trigger an alarm signal. More specifically, the determined remaining run time $\Delta t_i$ is compared to a predetermined time threshold value $\Delta t_{tr}$, and if the determined remaining run time $\Delta t_i$ is equal to or smaller than the predetermined time threshold value $\Delta t_{tr}$, the alarm signal is triggered. The alarm signal may be provided by the output means 12. The ouput means 12 can be visual (e.g. a display) and/or audible (e.g. loud speakers) means.

The device 6 may further comprise input means (not shown) allowing a user of the device 6 to enter data and/or information to be used by the computing device 10.

In the embodiment shown in FIG. 1, the device 6 is integrated into the appliance 4 that is powered by the battery 4 and the remaining run time $\Delta t_i$ of which is to be determined by the device 6. Alternatively, the device 6 may be provided as a module separate from the appliance 2. The separate module can be connected to the battery 4 supplying power to the appliance 2 or to the electric circuit of the appliance 2. According to a further alternative, the memory 16 can be provided as separate storage medium that is machine-readable and that stores a machine readable program code adapted to calculate the remaining run time $\Delta t_i$ of the battery 4.

The device 6 for determining the remaining run time $\Delta t_i$ of a battery 4 is adapted to carry out the following method for determining the remaining run time $\Delta t_i$ of said battery 4:

In a first step, the voltage $U_i$ supplied by the battery 4 during operation of the appliance 2 is measured periodically. The measured voltage values are compared with a predetermined voltage threshold value $U_{tr}$. For a Nickel-metal hydride battery supplying a maximum voltage of 5.6V, the voltage threshold value $U_{tr}$ can be chosen to amount to 4.8V. The comparison is performed by the comparator 14. Once the measured voltage value has dropped below (or reached) the predetermined voltage threshold value $U_{tr}$, the corresponding points in time $t_i$ are also measured by the measuring device 8. Alternatively, the measurement of the corresponding points in time $t_i$ is independent from the predetermined voltage threshold value $U_{tr}$. The resulting time-voltage-pairs $t_i$, $U_i$ are stored in the memory 16. An example of a typical voltage signal of a battery 4 is shown in FIG. 2. Here, the abscissa shows the time in seconds and the ordinate shows the measured voltage in Volts.

The measurement of the time-voltage-pairs $t_i$, $U_i$ shown in FIG. 2 does not start from the beginning of the total run time of the battery 4, but from a point in time $t_i=0$ that corresponds to approximately 90% of the total run time $T_1$. The overall voltage signal decreases as time passes. In particular, a slight decay of the measured voltage $U_i$ is followed by an abrupt voltage drop.

On a smaller time scale, voltage drops can be perceived that appear to be (nearly) periodical. These voltage drops result from the appliance 2 consuming power supplied by the battery 4.

In general, the voltage signal fluctuates from one measuring point to the following one. This shot-to-shot fluctuation exists in principle throughout the entire measurement. However, due to the resolution chosen in FIG. 2, it becomes visible in particular towards the end of the measurement.

In order to suppress the voltage signal fluctuations due to power consumption and the shot-to-shot fluctuations, the signal of the measured time-voltage-pairs $t_i$, $U_i$ is smoothed in a second step of the method. To this end a gliding window is applied to the measured signal and the maximum voltage value $\max(U_i)$ is selected for each window for further processing. The resultant smoothed signal is shown in FIG. 3. Alternatively other conventional smoothing methods may be applied.

The comparison of the measured voltage values with the predetermined voltage threshold value $U_{tr}$ in particular serves to trigger the calculation of the remaining run time $\Delta t_i$. If the measured voltage $U_i$ is greater than the predetermined voltage threshold value $U_{tr}$, no calculation is performed. By contrast, if the measured voltage $U_i$ is smaller than the predetermined voltage threshold value $U_{tr}$, the calculation of the remaining run time $\Delta t_i$, is initiated in a third step.

The calculation is performed by the CPU 18 of the computing device 10 which executes a program code that is stored in memory 16. The calculation basically relies on a relationship between the measured voltage $U_i$, the corresponding point in time $t_i$, and the total run time $T_1$ of the battery 4. Said relationship can be derived from a time dependent formulation of the so-called Nernst equation.

The Nernst equation generally describes an electrochemical cell (like the battery 4) in its equilibrium state, i.e., without any current flowing. As in the second step of the method only the maximum voltage value $\max(U_i)$ is selected for each window (that is the value $U_i$ corresponding to minimum current flow), the Nernst equation is a reasonable approximation for the description of the battery 4 that is supplying power to the appliance 2.

A battery is typically composed of two half cells. In a Nickel-metal hydride battery for example, one half cell consists of a Nickel oxyhydroxide (NiOOH) electrode in an alkaline electrolyte bath and the other half cell consists of a metal hydride (MH) electrode in an alkaline electrolyte bath, wherein the alkaline electrolyte baths comprise hydroxide ($OH^-$) ions. The Nernst equation for a battery correlates the potential difference (or voltage) $U_i$ between two half cells of the battery and the electrolyte concentration in each half cell of the battery.

During discharge of the Nickel-metal hydride battery the following reactions take place:

First half cell: $MH + OH^- M \rightarrow H_2O + e^-$

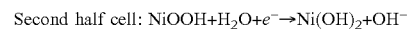

Second half cell: $NiOOH + H_2O + e^- \rightarrow Ni(OH)_2 + OH^-$

Assuming that the concentration of hydroxide ions in the first half cell, i.e., the hydroxide ions to be consumed during discharge of the battery, is the limiting factor for the discharge reaction in a (Nickel-metal hydride) battery, the Nernst equation for the first half cell reads:

$$E_1 = E_1^0 + \frac{2.3 \cdot RT}{zF} \cdot \log(1/[OH^-]_1) \qquad (I)$$

with—$E_1$ being the electrode potential of the first half cell,
$E_1^0$ being the standard electrode potential of the first half cell,
R being the the universal gas constant ($R=8.314$ $JK^{-1}$ $mol^{-1}$),
T being the temperature in Kelvin,
z being the number of exchanged electrons,
F being the Faraday constant ($F=96485.34$ $JV^{-1}$ $mol^{-1}$),

[OH⁻], being the concentration of hydroxide ions in the first half cell.

Correspondingly, the Nernst equation for the second half cell reads:

$$E_2 = E_2^0 + \frac{2{,}3 \cdot RT}{zF} \cdot \log(1/[OH^-]_2) \qquad (II)$$

with—$E_2$ being the electrode potential of the second half cell, $E_2^0$ being the standard electrode potential of the second half cell, R being the the universal gas constant (R=8.314JK$^{-1}$ mol$^{-1}$), T being the temperature in Kelvin, z being the number of exchanged electrons, F being the Faraday constant (F=96485.34 JV$^{-1}$ mol$^{-1}$),

[OH⁻]$_2$ being the concentration of hydroxide ions in the second half cell.

The potential difference $\Delta E = E_2 - E_1$ between both half cells describes the voltage U supplied by the battery (4) which is measured in the first step of the method. The Nernst equation for the entire battery thus reads:

$$U = \Delta E = \Delta E^0 + \frac{2{,}3 \cdot RT}{zF} \cdot \log\left(\frac{[OH^-]_1}{[OH^-]_2}\right) \qquad (III)$$

with—U being the voltage supplied by the battery, and $\Delta E^0 = E_2^0 - E_1^0$ being the standard cell potential of the battery in Volts.

Independent of the type of half cells, the Nernst equation of a battery can generally be expressed as:

$$U = \Delta E^0 + \frac{2{,}3 \cdot RT}{zF} \cdot \log\left(\frac{c_1}{c_2}\right) \qquad (IV)$$

with—U being the voltage supplied by the battery, $\Delta E^0$ being the standard cell potential of the battery in Volts, R being the the universal gas constant (R=8.314 JK$^{-1}$ mol$^{-1}$), T being the temperature in Kelvin, z being the number of exchanged electrons, F being the Faraday constant (F=96485.34 JV$^{-1}$ mol$^{-1}$), $c_1$ being the electrolyte concentration in the first half cell, and $c_2$ being the electrolyte concentration in the second half cell.

During operation of the battery 4, the concentrations $c_1$ and $c_2$ change, in particular $c_1$ decreases while $c_2$ increases. The voltage $U_i$ provided by the battery 4 at different points in time $t_i$ thus depends on the concentration changes. This dependency can be expressed in the Nernst equation as follows:

$$U_i = \Delta E^0 + \frac{2{,}3 \cdot RT}{zF} \cdot \log\left(\frac{c_1^0 - kt_i}{c_2^0 + kt_i}\right) \qquad (V)$$

with—$U_i$ being the voltage supplied by the battery at the point in time $t_i$, $c_1^0$ being the electrolyte concentration in the first half cell at the beginning of discharge ($t_i$=0), $c_2^0$ being the electrolyte concentration in the second half cell at the beginning of discharge ($t_i$=0), and k being the reaction rate constant of the electrochemical reaction.

Normalization of the logarithmic term of equation (V) by k yields:

$$U_i = \Delta E^0 + \frac{2{,}3 \cdot RT}{zF} \cdot \log\left(\frac{T_1 - t_i}{T_2 + t_i}\right), \qquad (VI)$$

where $T_1 = c_1^0/k$ and $T_2 = c_2^0/k$. As $c_1^0$ is the concentration of the electrolyte to be consumed in the first half cell in a reaction with the reaction rate constant k, $T_1$ represents the time period between $t_1=0$ and the point in time when this electrolyte is consumed. That is, $T_1$ represents the total run time of the battery. $T_2$ is a parameter that depends on the initial electrolyte concentration in the second half cell.

In order to determine the total run time $T_1$, a linear regression of the time-voltage-pairs $t_i$, $U_i$ is performed. The linear regression is performed using time-voltage-pairs $t_i$, $U_i$, where the measured voltage $U_1$ is smaller than the predetermined voltage threshold value $U_{tr}$, i.e., where the time values $t_i$ approach the end of the total run time $T_1$. The linear regression is based on a linear equation that is derived from the Nernst equation (VI).

Firstly, the Nernst equation (VI) is rewritten as $$x_i = \frac{T_1 - t_i}{T_2 + t_i}, \text{ where } x_i = 10^{((U_i - \Delta E^0) \cdot \frac{zF}{2{,}3 \cdot RT})}. \qquad (VII)$$

As $T_2$ is much larger than $t_i$, equation (VII) can be approximated by $$x_i = \frac{T_1 - t_i}{T_2}. \qquad (VIII)$$

Equation (VIII) is a linear equation with parameters $T_1$ and $T_2$ and variables $x_i$ and $t_i$. The variable $x_i$ depends on the measured voltage $U_i$ and on (constant) parameters so that $x_i$ can be calculated directly from the measured voltage value $U_i$. Assuming that $$A = -\frac{1}{T_2} \text{ and } B = \frac{T_1}{T_2}$$

equation (VIII) can be written as $$x_i = At_i + B. \qquad (IX)$$

The linear regression is performed by searching the least square fit for n time-voltage pairs $t_i$, $U_i$ using equation (IX). For example, the linear regression is performed with n=200 time-voltage pairs $t_i$, $U_i$. Accordingly, the parameters A and B have to be chosen to minimize the function $$f(A, B) = \sum_{i=1}^{n} (x_i - (At_i + B))^2. \qquad (X)$$

The resulting values for A and B, also referred to as best fit parameters, are $$A = \frac{\sum_{i=1}^{n} x_i t_i - n\bar{x}\bar{t}}{\sum_{i=1}^{n} t_i^2 - n\bar{t}^2} \text{ and } B = \bar{x} - A\bar{t}, \text{ where } \bar{x} = \frac{1}{n}\sum_{i=1}^{n} x_i \text{ and}$$

$$\bar{t} = \frac{1}{n}\sum_{i=1}^{n} t_i.$$

The CPU 18 finally determines the remaining run time $\Delta t_i$ at the point in time $t_i$ of the battery 4 according to $$\Delta t_i = T_1 - t_i. \quad (XI)$$

In a fourth step of the method, an output signal is generated by the output means 12 warning a user that the appliance 2 will soon shut down for lack of power, if the remaining run time $\Delta t_i$ is below the predetermined time threshold value $\Delta t_{tr}$. The time threshold value $\Delta t_i$ may depend on the type of the appliance 2 and is chosen such as to comply with (inter)national standards and requirements. According to one embodiment, the time threshold value $\Delta t_i$ is between 15 and 90 minutes, preferably between 30 and 60 minutes.

The invention claimed is:

1. Method for determining the remaining run time ($\Delta t_i$) of a battery that is supplying power to an appliance, comprising the steps of:
   during operation of the appliance measuring the voltage ($U_i$) supplied by the battery at different points in time ($t_i$) in order to obtain time-voltage-pairs ($t_i$, $U_i$), and
   calculating the remaining run time ($\Delta t_i$) of the battery, wherein the calculation is based on the measured time-voltage-pairs ($t_i$, $U_i$) and on a relationship between the measured voltage ($U_i$), the corresponding point in time ($t_i$) and the total run time ($T_1$) of the battery which can be derived from a time dependent formulation of the Nernst equation for this relationship.

2. Method according to claim 1, wherein the calculation of the remaining run time ($\Delta t_i$) of the battery is carried out when the measured voltage ($U_i$) drops below a predetermined voltage threshold value ($U_{tr}$).

3. Method according to claim 1, wherein the remaining run time ($\Delta t_i$) at a specific point in time $t_i$ reads $\Delta t_i = T_1 - t_i$.

4. Method according to claim 1, wherein the time dependent formulation of the Nernst equation reads:

$$U_i = C_1 + C_2 T \cdot \log\left(\frac{T_1 - t_i}{T_2 + t_i}\right)$$

with—$U_i$ being the measured voltage supplied by the battery at the point in time $t_i$,
$C_1$ being a constant relating to the standard cell potential of the battery,
$C_2$ being a constant that depends on the type of battery,
T being the temperature,
$T_1$ being the total run time of the battery, and
$T_2$ being a parameter depending on the initial state of the battery.

5. Method according to claim 1, wherein the relationship for the measured time-voltage-pairs ($t_i$, $U_i$) reads $$x_i = \frac{T_1 - t_i}{T_2} \text{ with } x_i = 10^{\left(\frac{U_i - C_1}{C_2 T}\right)}$$

$U_i$ being the measured voltage supplied by the battery at the point in time $t_i$,
$C_1$ being a constant relating to the standard cell potential of the battery,
$C_2$ being a constant that depends on the type of battery,
T being the temperature,
$T_1$ being the total run time of the battery, and
$T_2$ being a parameter depending on the initial state of the battery.

6. Method according to claim 1, wherein the total run time ($T_1$) of the battery (4) is determined by linear regression of the time-voltage-pairs ($t_i$, $U_i$).

7. Method according to claim 6, wherein the linear regression is performed by minimizing the function $$f(A, B) = \sum_{i=1}^{n} (x_i - (At_i + B))^2, \text{ where } A = -\frac{1}{T_2}, B = \frac{T_1}{T_2}$$

and n is the number of time-voltage-pairs ($t_i$, $U_i$) used for the linear regression.

8. Method according to claim 1, wherein the measured time-voltage-pairs ($t_i$, $U_i$) are subjected to a smoothing method prior to performing the calculation.

9. Method according to claim 1, wherein a gliding window is applied to the measured time-voltage-pairs ($t_i$, $U_i$) and the time-voltage-pair ($t_i$, $U_i$) with maximum voltage value (max($U_i$)) is selected from each window to perform the calculation.

10. Method according to claim 1, wherein an output signal is generated if the remaining run time ($\Delta t_i$) is found to be below a predetermined time threshold value ($\Delta t_{tr}$).

11. A device for determining the remaining run time ($\Delta t_i$) of a battery that is supplying power to an appliance, comprising:
   a measuring device adapted to measure the voltage ($U_i$) supplied by the battery at different points in time ($t_i$) during operation of the appliance in order to obtain time-voltage-pairs ($t_i$, $U_i$), and
   a computing device programmed to calculate the remaining run time ($\Delta t_i$) of the battery on the basis of the measured time-voltage-pairs ($t_i$, $U_i$) and of a relationship between the measured voltage ($U_i$), the corresponding point in time ($t_i$) and the total run time ($T_1$) of the battery which can be derived from a time dependent formulation of the Nernst equation for this relationship.

12. A device according to claim 11, further comprising a comparator (14) configured to compare the measured voltage ($U_i$) with a predetermined voltage threshold value ($U_{tr}$) and to initiate the calculation of the remaining run time ($\Delta t_i$) by the computing device (10) if the measured voltage ($U_i$) drops below the predefined voltage threshold value ($U_{tr}$).

13. A device according to claim 11, wherein the device is configured to carry out
   a method for determining the remaining run time ($\Delta t$) of a battery that is supplying power to an appliance, the comprising the steps of:
   during operation of the appliance measuring the voltage (Ui) supplied by the battery at different points in time (ti) in order to obtain time-voltage-pairs (ti, Ui), and calculating the remaining run time ($\Delta t_i$) of the battery, wherein the calculation is based on the measured time-voltage-pairs ($t_i$, $U_i$) and on a relationship between the measured voltage ($U_i$), the corresponding point in time ($t_i$) and the total run time (T) of the battery which can be derived from a time dependent formulation of the Nernst equation for this relationship.

14. A non-transitory machine-readable storage medium comprising a machine-readable program code, adapted to be executed by a device for determining the remaining run time ($\Delta t_i$) of a battery that is supplying power to an appliance, and making the device carry out the method according to claim 1 when the device is executing the program code.

* * * * *